(12) United States Patent
Seddon

(10) Patent No.: US 11,987,874 B2
(45) Date of Patent: May 21, 2024

(54) BACKSIDE METAL FORMATION METHODS AND SYSTEMS

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 792 days.

(21) Appl. No.: 16/254,904

(22) Filed: Jan. 23, 2019

(65) Prior Publication Data
US 2020/0232086 A1 Jul. 23, 2020

(51) Int. Cl.
 *C23C 14/18* (2006.01)
 *C23C 14/24* (2006.01)
 *C23C 14/58* (2006.01)

(52) U.S. Cl.
 CPC ............ *C23C 14/18* (2013.01); *C23C 14/243* (2013.01); *C23C 14/5873* (2013.01)

(58) Field of Classification Search
 CPC .... C23C 14/18; C23C 14/246; C23C 14/5873
 See application file for complete search history.

(56) References Cited

U.S. PATENT DOCUMENTS

| | | | | |
|---|---|---|---|---|
| 4,070,264 A | * | 1/1978 | Loiseau | H01L 23/522 204/298.31 |
| 6,287,430 B1 | * | 9/2001 | Matsumoto | C23C 14/568 118/719 |
| 8,481,344 B2 | * | 7/2013 | Luu | C23C 14/545 118/712 |
| 2012/0153421 A1 | * | 6/2012 | Kawamura | H10K 50/84 427/536 |
| 2014/0045340 A1 | * | 2/2014 | Burgess | H01L 21/67253 438/758 |
| 2018/0202040 A1 | * | 7/2018 | Mullapudi | H01J 37/32724 |

OTHER PUBLICATIONS

Rapps et al., "3M Wafer Support System Temporary bonding for 3D TSV," 3D TSV Summit Grenoble, Jan. 19, 2016.

* cited by examiner

*Primary Examiner* — Monica D Harrison
*Assistant Examiner* — Andre C Stevenson
(74) *Attorney, Agent, or Firm* — Adam R. Stephenson, LTD.

(57) ABSTRACT

Implementations of methods of forming a metal layer on a semiconductor wafer may include: placing a semiconductor wafer into an evaporator dome and adding a material to a crucible located a predetermined distance from the semiconductor wafer. The semiconductor wafer may include an average thickness of less than 39 microns. The method may also include heating the material in the crucible to a vapor and depositing the material on a second side of the semiconductor wafer.

19 Claims, 3 Drawing Sheets

BACKSIDE METAL FORMATION METHODS AND SYSTEMS

BACKGROUND

1. Technical Field

Aspects of this document relate generally to systems and methods used for applying metallization to substrates. More specific implementations involve semiconductor substrates.

2. Background

Semiconductor substrates are used to form a wide variety of semiconductor devices. The semiconductor devices are generally distributed across a planar surface of the semiconductor substrate in a plurality of die. A metal layer may be formed on a side of the semiconductor substrate opposite the plurality of die.

SUMMARY

Implementations of methods of forming a metal layer on a semiconductor wafer may include: placing a semiconductor wafer into an evaporator dome and adding a material to a crucible located a predetermined distance from the semiconductor wafer. The semiconductor wafer may include an average thickness of less than 39 microns. The method may also include heating the material in the crucible to a vapor and depositing the material on a second side of the semiconductor wafer.

Implementations of methods of forming a metal layer on a semiconductor wafer may include may include one, all, or any of the following:

Heating may include one of resistive heating or electron beam heating.

The semiconductor may include a plurality of die on a first side of the semiconductor wafer.

The semiconductor wafer may include an edge ring around a perimeter of the semiconductor wafer.

The first side of the semiconductor wafer may be coupled to a backgrinding tape.

The second side of the semiconductor wafer may not be coupled to a backgrinding tape.

The material in the crucible may be a metal including one of titanium, gold, copper, tin, tungsten, aluminum, silver, nickel, chromium, or any combination thereof.

The method may further include etching the wafer and etching may include wet etching.

The semiconductor wafer may not be coupled to a carrier.

Implementations of methods of forming a metal layer on a semiconductor wafer may include: placing a semiconductor wafer into an evaporator dome and adding a material to a crucible located a predetermined distance from the semiconductor wafer. The semiconductor wafer may include a first side and a second side. The method may also include coupling the material with the second side of the semiconductor die through heating. Heating may include resistive heating or electron beam heating. The semiconductor wafer may include an average thickness of less than 10 microns.

Implementations of methods of forming a metal layer on a semiconductor wafer may include may include one, all, or any of the following:

The semiconductor wafer may include an edge ring around a perimeter of the semiconductor wafer.

The first side of the semiconductor wafer may be coupled to a backgrinding tape.

The material in the crucible is a metal including one of titanium, gold, copper, tin, tungsten, aluminum, silver, nickel, chromium, or any combination thereof.

The method may further include etching the wafer and etching may include wet chemical etching.

The semiconductor wafer may not be coupled to a carrier.

Implementations of methods of forming a metal layer on a semiconductor wafer may include: placing a semiconductor wafer into an evaporator dome and coupling a material with the second side of the semiconductor wafer through heating. The semiconductor wafer may have an average thickness between 5 microns and 39 microns. Heating may include resistive heating or electron beam heating. The wafer may not be coupled with a carrier.

Implementations of methods of forming a metal layer on a semiconductor wafer may include may include one, all, or any of the following:

The average thickness of the wafer semiconductor may be 25 microns.

The semiconductor wafer may include an edge ring around a perimeter of the semiconductor wafer.

The first side of the semiconductor wafer may be coupled to a backgrinding tape.

The method may further include etching the wafer, wherein etching includes wet chemical etching.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
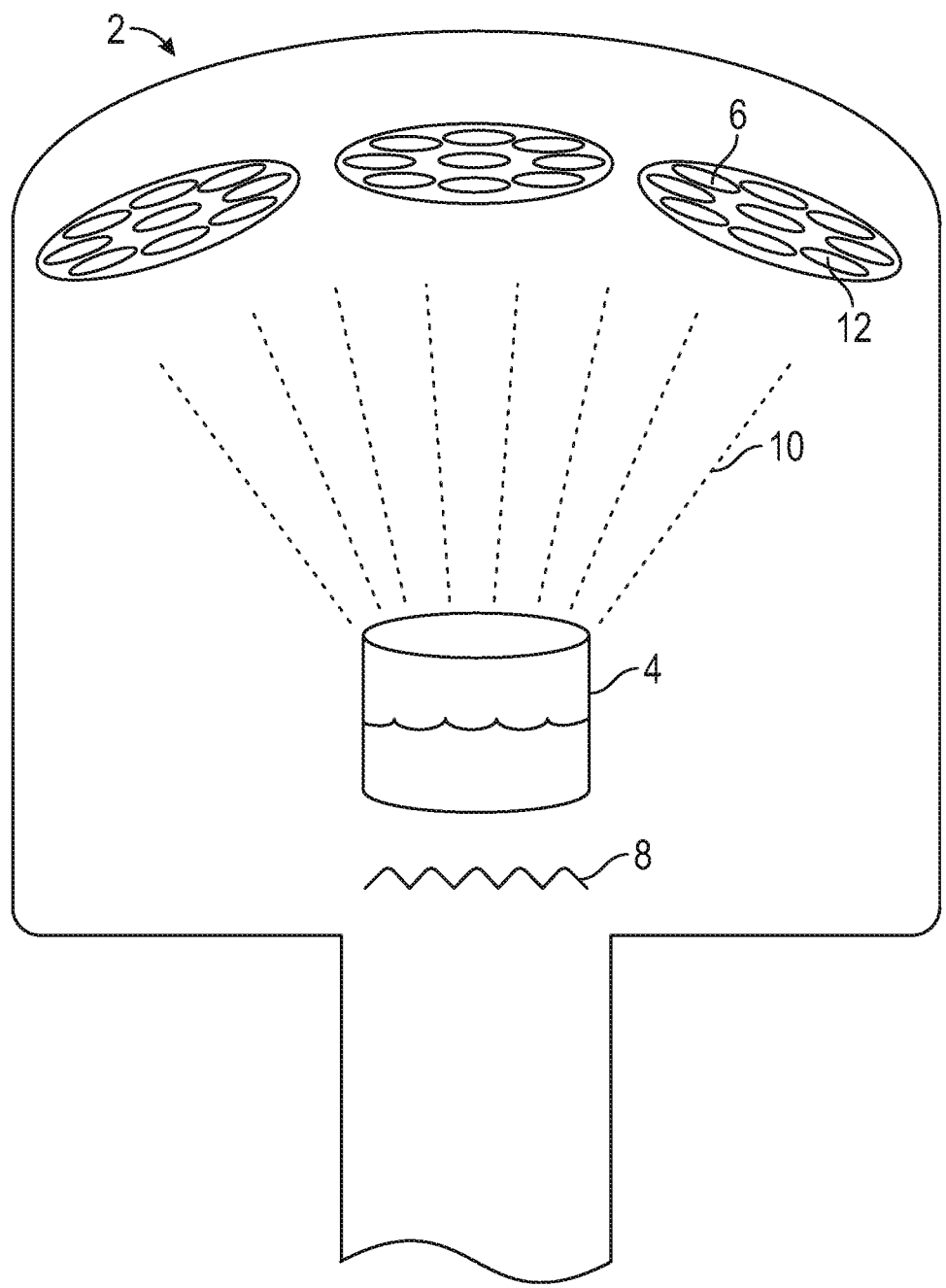
FIG. 1 is an inside view of an implementation of an evaporator dome.

This disclosure, its aspects and implementations, are not limited to the specific components, assembly procedures or method elements disclosed herein. Many additional components, assembly procedures and/or method elements known in the art consistent with the intended backside metal formation systems and methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such backside metal formation methods and systems, and implementing components and methods, consistent with the intended operation and methods.

For semiconductor die that have an average thickness of less than 40 microns in thickness, particular processing challenges exist. Die handling, die strength, and performing processing operations with the die all present specific challenges, as die and wafer breakage can significantly reduce yield and/or affect device reliability. Die strength is negatively affected by traditional singulation options like sawing which induce die chipping and cracking along the die streets. These chips and cracks formed during the sawing process can eventually propagate during operation and reliability testing causing the die to fail. Damage may also occur as part of the process of forming a metal layer on a second side of the wafer. The wafer may be damaged while removing the wafer from a carrier.

The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "wafer" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate may include a substrate material such as, by non-limiting example, single crystal silicon, silicon dioxide, glass, gallium arsenide, sapphire, ruby, silicon on insulator, silicon carbide, polycrystalline or amorphous forms of any of the foregoing, and any other substrate material useful for constructing semiconductor devices. In particular implementations, the substrate may be a silicon-on-insulator substrate.

In various implementations disclosed in this document, the semiconductor substrate includes a plurality of semiconductor die that have been processed using a semiconductor fabrication process to form one or more semiconductor devices therein or thereon (not shown). The plurality of die have been processed on a first side or active side of the semiconductor substrate. This may include forming a plurality of layers on a first side the substrate. The plurality of layers may be patterned, and in various implementations, may be patterned (or otherwise removed) to not be over a die street in the substrate. The plurality of layers may include, by non-limiting example, one or more metal layers, one or more passivation layers, any other layer, and any combination thereof. In various implementations, the plurality of die may include power semiconductor devices, such as, by non-limiting example, a MOSFET, an IGBT, or any other power semiconductor device. In other implementations, the plurality of die may include non-power semiconductor devices.

Following the completion of the fabrication process (or during some portion of it, in some implementations), the semiconductor substrate is thinned on a side of the semiconductor substrate that is opposite the side on which the one or more semiconductor devices have been formed to a desired substrate thickness. The thinning process takes place using backgrinding, lapping, etching, any combination thereof, or any other technique for removing the material of the semiconductor substrate substantially uniformly across the largest planar surface of the substrate.

In various implementations, the substrate may be thinned to an average thickness less than 50 microns ($\mu$m). As used herein, "average thickness" is a substrate average thickness across at least a majority of the surface of the substrate. In other implementations, the substrate may be thinned to an average thickness less than 30 $\mu$m. In still other implementations, the substrate may be thinned to an average thickness less than 100 $\mu$m, more than 100 $\mu$m, and in other various implementations, the substrate may not be thinned. In particular implementations, the substrate may be thinned to an average thickness of 25 $\mu$m, and in other particular implementations, the substrate may be thinned to an average thickness of 75 $\mu$m. The substrate may be thinned through backgrinding, etching, or any other thinning technique.

In various implementations, the thinning process may create an edge ring around the wafer (like that present in the backgrinding process marketed under the tradename TAIKO by Disco Hi-Tec America, Inc. of Santa Clara, California). The edge ring acts to structurally support the wafer following thinning so that no wafer carrier may need to be utilized during subsequent processing steps. In various implementations, the thinning process may be carried out after the semiconductor substrate has been mounted to a backgrinding tape whether an edge ring is formed during backgrinding or not. A wide variety of backgrinding tapes may be employed in various implementations, including those that are compatible with subsequent plasma etching operations. In other implementations, the semiconductor substrate may not be coupled to a backgrinding tape.

In various implementations, following the thinning process a metal layer is applied to a second side of the semiconductor substrate. In some implementations, the metal layer may be referred to as a backside metal layer or back metal. In various implementations, the back metal layer may be copper or a copper alloy. In some implementations, the metal may include tungsten, tin, gold, titanium, aluminum, silver, nickel, chromium, alloys thereof, or any combination thereof. In other implementations, the backside metal layer may include any other type of metal, alloy thereof, or combination thereof. In various implementations, the backside metal layer may be about 10 $\mu$m thick. In other implementations, the backside metal layer may be more or less thick than 10 $\mu$m.

For thin wafers in the range from 5-39 microns sputtering metal depositions process apply too much energy into the thinned substrate. As a result, sputtering increases the temperature of the wafer and can overheat the thin substrate in a very short amount of time. In various processes, the wafer over heats in a few seconds. The thermal energy comes from ion bombardment during the sputtering process The energy may also come from infrared heating from the plasma formed around the substrate. Slowing down the sputtering process to decrease the energy and heat the wafer is subjected to may slow down the process too much for current desired processing cycle times. Cooling chucks may not be a feasible tool for use with ultrathin wafers in a sputtering chamber. An electrostatic chuck may not work with ultrathin wafers because insufficient capacitance is generated by the thinned wafer to allow it to couple with the chuck.

In this document, various implementations of a method of forming a metal layer on a semiconductor wafer using evaporation are disclosed. Referring to FIG. 1, a diagram of an evaporator dome 2 is illustrated. The evaporator dome 2 includes a crucible 4. In various implementations, the crucible may contain one compartment or may represent multiple compartments, each its own crucible. Within the different compartments are different materials that may be evaporated onto a second side or backside of a wafer. The materials in the compartments/crucibles may be metals including but not limited to, tungsten, copper, titanium, gold, alloys, and any other metals used for back metallization or seed metal on a non-active side of a wafer. In this particular implementation, various wafers/substrates 6 are positioned a predetermined distance above the crucible 4 in wafer holders 12. Here, a heating element 8 is positioned under the crucible 4. In various implementations, the heating element 14 may be and inductive heating element and may be positioned around the crucible 16 as illustrated in FIG. 2.

Figure 2:
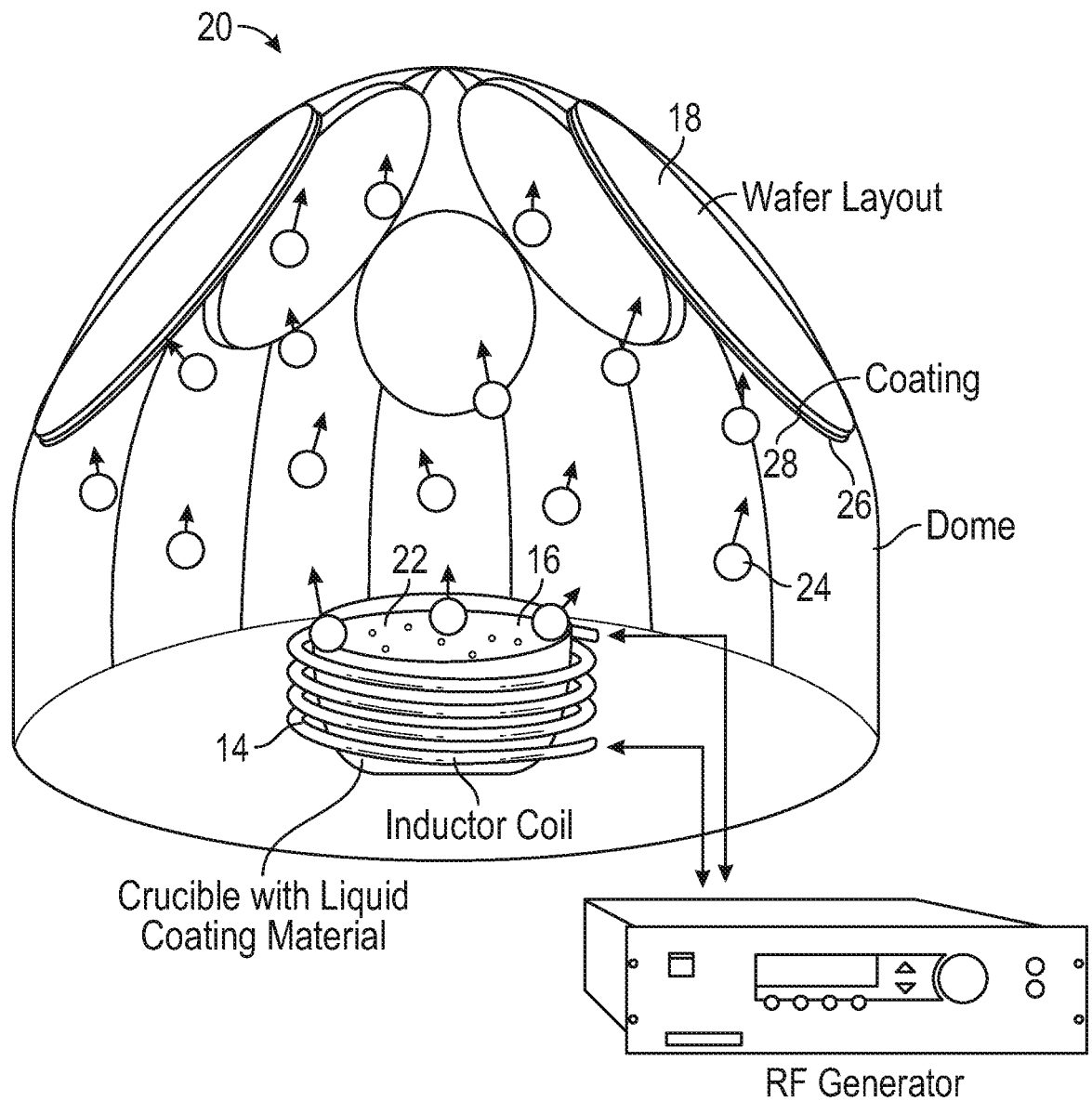
FIG. 2 is an inside view of another implementation of an evaporator dome.

The method may include, in various implementations as illustrated in FIG. 2, using a radio frequency (RF) generator to operate the heating element 8 to heat the crucible 4 to cause one or more of the materials in the crucible to vaporize and couple to the second side of the wafers 18.

In various other implementations, the heating of the crucible may include resistive heating or electron beam heating. During the resistive heating process, the material in the crucible may be in a high-vacuum environment and heated to its evaporation point by heating of the crucible using an electrically resistive heating element. The vaporized molecules then travel from the source to the substrate/wafer where they nucleate together on the substrate/wafer, forming a thin film coating. A wide variety of materials can be deposited using this technique such as aluminum, silver, nickel, chrome, magnesium, or any other materials mentioned herein.

In electron beam heating implementations, current is first passed through a filament which leads to heating of the filament and subsequent electron emission. High voltage is applied between the filament and the hearth to accelerate liberated electrons towards the crucible containing the material to be deposited. A strong magnetic field focuses the electrons into a unified beam; upon arrival, the energy of this beam of electrons is transferred to the deposition material, causing it to evaporate (or sublimate) and eventually deposit onto the substrate/wafer. Adding a partial pressure of reactive gas, such as oxygen or nitrogen to the chamber during evaporation can be used to reactively deposit non-metallic film materials.

In some implementations of a method of forming a metal layer on a second side of a semiconductor wafer, the various compartments of the crucible may be covered to exclude particular materials from coupling to the second side of the wafer during a deposition step. In other implementations, two or more compartments may be uncovered at the same time to form a metal coating including a combination of materials. Sequential covering and uncovering of various compartments may be used to form layers of various materials one on each other.

Figure 3:
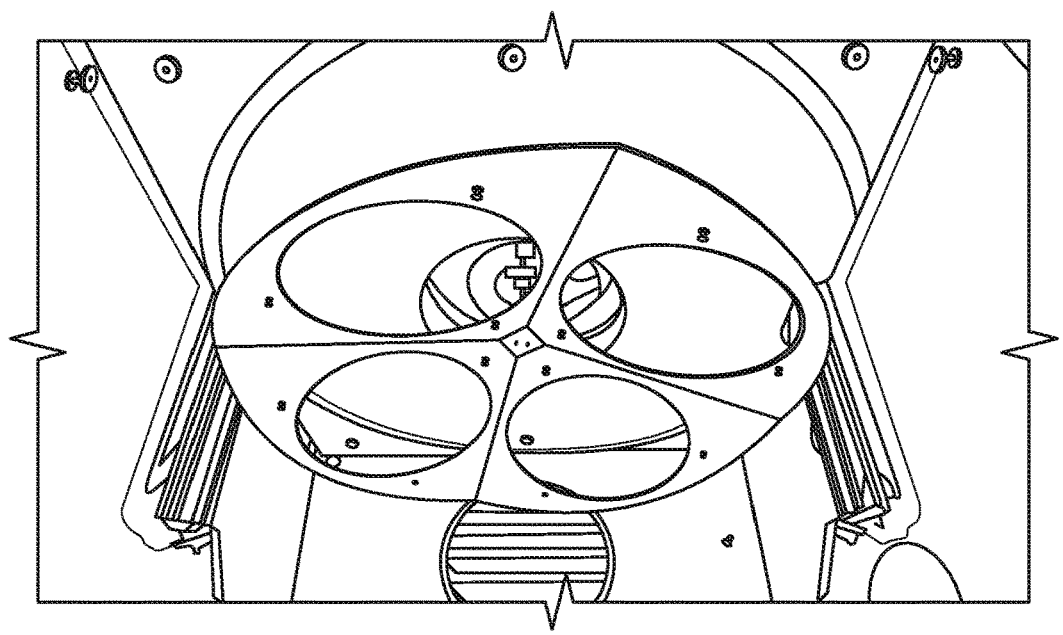
FIG. 3 is a bottom perspective view of an implementation of a wafer holding assembly.
Figure 4:
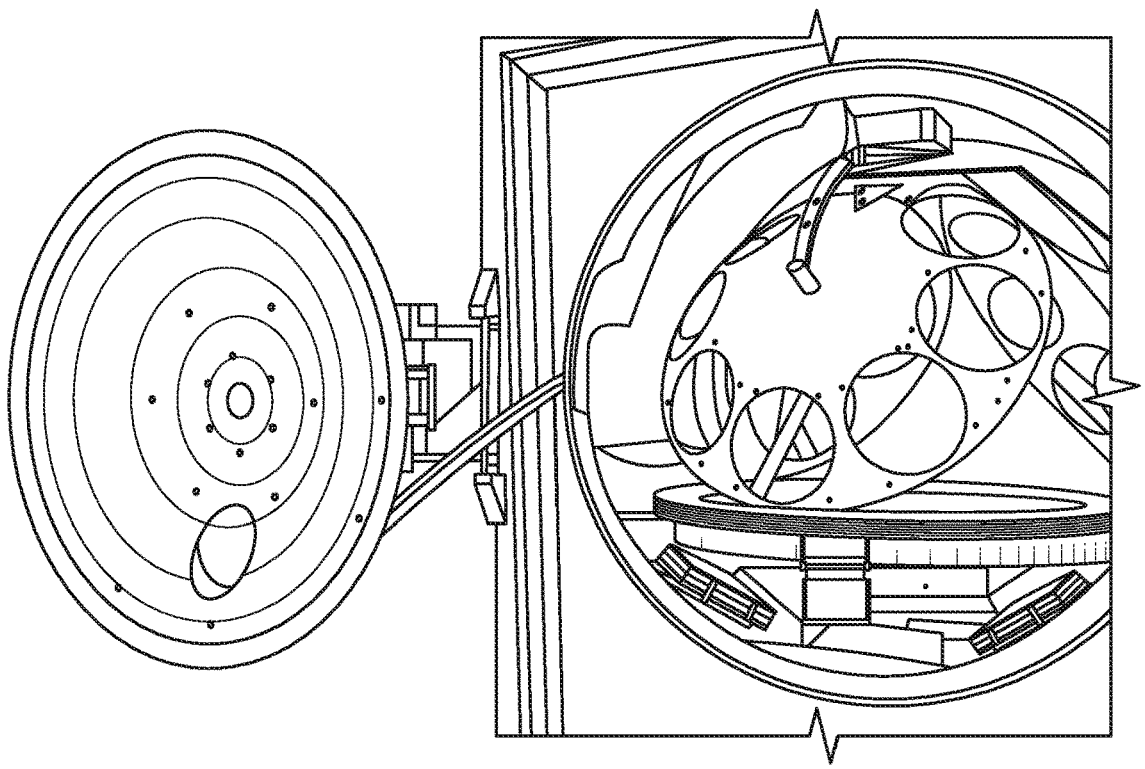
FIG. 4 is an inside view of an implementation of an evaporator machine.

Referring to FIG. 2, another implementation of a method of forming a metal layer on a semiconductor wafer is illustrated. The method may include placing a semiconductor wafer/substrate 18 into an evaporator dome 20. In various implementations, the wafer 18 may have a thickness of less than 39 microns. In some implementations, the wafer 18 may have an average thickness of about 10 microns. In other implementations, the wafer may have an average thickness of about 25 microns. Wafers having average thicknesses between about 5-39 microns may crack during removal from standard carriers such as glass plates, carrier wafers, wafer holders such as those illustrated in FIGS. 3 and 4, or other standard wafer carriers used in semiconductor wafer handling. Various implementations of the method may include the wafer having an edge ring disposed around the perimeter of the wafer. In such implementations, the edge ring of the wafer may be handled with tweezers. In some implementations, the wafer may be handled with a vacuum device like a wafer wand or a non-contact Bernoulli handler. In various implementations, a first side of the semiconductor wafer may be coupled to a tape. The tape may be, by non-limiting example, a backgrinding tape, a picking tape, or various other tapes for securing and stabilizing a semiconductor wafer. In other implementations, the semiconductor wafer may not be coupled to a tape.

The method may include heating the material 22 in the crucible 16 to a vapor 24 using any of the heating methods disclosed in this document. In the system illustrated in FIG. 2, an inductive heating system is employed. The material may couple with a second side 26 of the semiconductor wafer 18, thereby depositing the material on a second side of the wafer and forming a coating. In various implementations, the evaporator dome may rotate during vaporize of the material to aid in deposition of an even coating of material on the second side of the semiconductor wafer. The wafers may be coupled into an opening in the evaporator dome resembling an orange slice peel. For wafers having a diameter of 6 inches, 32 wafers may be processed in a single evaporator in various implementations. In other implementations, 12 wafers may be processed in a single evaporator of the same size with wafers having a diameter of 8 inches.

In various implementations of a method of forming a metal layer on a second side of a semiconductor wafer, the layers may include back metallization and/or seed metal layers. The method may further include etching any of the layers prior to forming the metal layer. In some implementations, the etching may include wet chemical etching. In various implementations, etching of the wafer may be part of an alignment and singulation method for use in subsequent processing steps. In other implementations, etching may be part of a patterning method for eventual use in subsequent packaging steps. In still other implementations, the substrate may be chemically etched to remove backside damage following thinning to clean the surface for application of back metal. In other implementations, the chemical etching of the substrate may be carried out to roughen the second side of the semiconductor wafer to increase the adhesion of the back metal.

After forming the metal layer on the second side of the semiconductor wafer additional processing steps may be performed following removal of the wafer/substrate from the evaporator system. Additional processing steps may include singulating the plurality of semiconductor die from the wafer. Singulating may include plasma etching, lasering, or sawing. In some implementations, singulation may be performed from the backside/second side of the wafer. Singulation may include aligning the wafer using aligning features on a front side of the wafer. The aligning features may be included in the streets between the plurality of die. In various implementations, the aligning features may be located on an edge of the die. When the wafer is aligned, a plurality of alignment marks may be formed on a second side of the wafer through lasering, sawing, or scribing. Scribing may include using a stylus or scribing tool. The plurality of alignment marks may resemble perforation marks on the second side of the wafer. The plurality of alignment marks may be detectable with a visible light camera or with an infrared camera. Singulation methods may also include forming grooved lines in the backside of the wafer using sawing, lasering, or scribing. The metal layer may have a remaining thickness of 1 micron in the groove lines. The plurality of die may be then singulated through sawing or lasering through the groove lines.

Additional alignment methods may include applying photoresist to a second side of a wafer before application of a metal layer and patterning the photoresist. The photoresist may prevent the metal layer from forming in the areas covered by the photoresist. After forming the metal layer, the photoresist may then be removed to reveal two or more alignment marks protected during the metal deposition process. Alignment features within the die streets or die in the areas not covered by the photoresist may be detectable through the two or more alignment marks using visible light cameras or infrared cameras.

In another implementation of a method for aligning and singulating a semiconductor wafer, the method may include forming the metal layer over the edge support ring. The edge support ring may then be ground to remove the metal layer around a perimeter of the wafer and to form an edge exclusion area. Using an infrared camera, three or more alignment features may be detectable through the remaining, non-metallized edge exclusion area. After aligning the wafer, a plurality of die may be singulated from the wafer using a laser, a saw, or plasma etching.

In places where the description above refers to particular implementations of methods of forming a metal layer and implementing components, sub-components, methods and sub-methods, it should be readily apparent that a number of modifications may be made without departing from the spirit thereof and that these implementations, implementing components, sub-components, methods and sub-methods may be applied to other methods of forming a backside metal layer.

What is claimed is:

1. A method of forming a metal layer on a semiconductor wafer, the method comprising:
    placing a semiconductor wafer into an evaporator dome, the semiconductor wafer comprising an average thickness of less than 39 microns;
    adding a material to a crucible located a predetermined distance from the semiconductor wafer;
    heating the material in the crucible to a vapor; and
    depositing the material on a second side of the semiconductor wafer.

2. The method of claim 1, wherein heating comprises one of resistive heating or electron beam heating.

3. The method of claim 1, wherein the semiconductor wafer comprises a plurality of die on a first side of the semiconductor wafer.

4. The method of claim 1, wherein the semiconductor wafer comprises an edge support ring around a perimeter of the semiconductor wafer.

5. The method of claim 1, wherein a first side of the semiconductor wafer is coupled to a backgrinding tape.

6. The method of claim 1, wherein a first side of the semiconductor wafer is not coupled to a backgrinding tape.

7. The method of claim 1, wherein the material in the crucible is a metal comprising one of titanium, gold, copper, tin, tungsten, aluminum, silver, nickel, chromium, or any combination thereof.

8. The method of claim 1, the method further comprising etching the semiconductor wafer, wherein etching comprises wet chemical etching.

9. The method of claim 1, wherein the semiconductor wafer is not coupled to a carrier.

10. A method of forming a metal layer on a semiconductor wafer, the method comprising:
    placing a semiconductor wafer into an evaporator dome, the semiconductor wafer comprising a first side and a second side;
    adding a material to a crucible located a predetermined distance from the semiconductor wafer; and
    coupling the material with the second side of the semiconductor wafer through heating;
    wherein heating comprises one of resistive heating or electron beam heating; and
    wherein the semiconductor wafer comprises an average thickness of less than 10 microns.

11. The method of claim 10, wherein the semiconductor wafer comprises an edge ring around a perimeter of the semiconductor wafer.

12. The method of claim 10, wherein the first side of the semiconductor wafer is coupled to a backgrinding tape.

13. The method of claim 10, wherein the material in the crucible is a metal comprising one of titanium, gold, copper, tin, tungsten, aluminum, silver, nickel, chromium, or any combination thereof.

14. The method of claim 10, the method further comprising etching the semiconductor wafer, wherein etching comprises wet chemical etching.

15. The method of claim 10, wherein the semiconductor wafer is not coupled to a carrier.

16. A method of forming a metal layer on a semiconductor wafer, the method comprising:
    placing a semiconductor wafer into an evaporator dome, the semiconductor wafer comprising an average thickness between 5 microns and 39 microns;
    coupling a material with a second side of the semiconductor wafer through heating;
    wherein heating comprises one of resistive heating or electron beam heating; and
    wherein the semiconductor wafer comprises an edge ring around a perimeter of the semiconductor wafer.

17. The method of claim 16, wherein the average thickness of the semiconductor wafer is 25 microns.

18. The method of claim 16, wherein a first side of the semiconductor wafer is coupled to a backgrinding tape.

19. The method of claim 16, the method further comprising etching the semiconductor wafer, wherein etching comprises wet chemical etching.

* * * * *